United States Patent [19]
Tsang

[11] Patent Number: 5,606,573
[45] Date of Patent: Feb. 25, 1997

[54] METHOD AND APPARATUS FOR CONTROL OF LASING WAVELENGTH IN DISTRIBUTED FEEDBACK LASERS

[75] Inventor: Won-Tien Tsang, Holmdel, N.J.

[73] Assignee: Lucent Technologies Inc., Murray Hill, N.J.

[21] Appl. No.: 608,984

[22] Filed: Feb. 29, 1996

Related U.S. Application Data

[63] Continuation of Ser. No. 114,125, Aug. 30, 1993, abandoned.

[51] Int. Cl.⁶ .............................. H01S 3/08; H04J 14/02; H01L 21/20; G02B 6/12
[52] U.S. Cl. .................. 372/96; 372/43; 372/45; 372/50; 372/102; 359/124; 359/130; 437/51; 437/129; 385/14; 385/37
[58] Field of Search .................. 372/43, 44, 48, 372/50, 92, 96, 99, 102; 359/115, 124, 130, 133, 134; 437/51, 129, 134, 130; 385/14, 37, 129, 130, 131, 132

[56] References Cited

U.S. PATENT DOCUMENTS

| | | | |
|---|---|---|---|
| 4,309,667 | 1/1982 | Di Forte et al. | 372/96 |
| 4,833,687 | 5/1989 | Hirata | 372/96 |
| 5,088,105 | 2/1992 | Scifres et al. | 372/92 |
| 5,103,456 | 4/1992 | Scifres et al. | 372/50 |
| 5,231,642 | 7/1993 | Scifres et al. | 372/45 |
| 5,337,328 | 8/1994 | Lang et al. | 372/45 |

FOREIGN PATENT DOCUMENTS

| | | | |
|---|---|---|---|
| 2417866 | 9/1979 | France | 372/96 X |
| 57-084189 | 5/1982 | Japan | 372/43 X |
| 58-048981 | 3/1983 | Japan | 372/43 X |
| 62-124791 | 6/1987 | Japan | 372/96 X |

OTHER PUBLICATIONS

Borchert, B., Stemuller, B., Gessner, R., "Fabrication and Characteristics of Improved Quantum-Well GaInAlAs Gain-Coupled DFB Lasers," Electronics Letters, 21 Jan. 1993, pp. 210–211.

Tsang, W. T., Kapre, R. M., Logan, R. A., Tanbun-Ek, T., "Control of Lasing Wavelength in Distributed Strips with Respect to the Grating," IEE Photonics Technology Letters, vol. 5, No. 9, Sep. 1993, pp. 978–980.

Pakulski et al., "Fused silica masks for printing uniform and phase adjusted gratings for distributed feedback lasers," Appl. Phys. Lett. 62(3), (Jan. 1993), at 222–24.

Okuda et al., "Monothlithically integrated GaInAsP/InP distributed feedback lasers," Fourth Int'l Conf. Integrated Optics and Optical Fiber Comm., Tokyo, Japan, (Jun. 1983), paper 38B1-4.

Tsang et al., "Semiconductor distributed feedback lasers with quantum well or superlattice gratings for index or gain-coupled optical feedback," Appl. Phys. Lett. 60(21), (May 1992), at 2580–82.

Senior, J. M., *Optical Fiber Communications—Principles and Practice*, (Prentice Hall, 2nd ed., 1992), at 311–20, 332–36, 546–48.

*Primary Examiner*—Brian Healy

[57] ABSTRACT

A method and apparatus for control of lasing wavelength in distributed feedback lasers using an improved waveguide. The waveguide comprises a periodic structure or grating and an active stripe which is oriented at a nonzero angle Θ with respect to a line perpendicular to the lines of the grating. Incremental changes in the operating wavelength of a plurality of lasers can be achieved by forming the active stripe of each waveguide of each laser at a different angle Θ. This method and apparatus provides a fine degree of control over the operating wavelength of distributed feedback lasers and is particularly useful in high capacity optical communications networks.

16 Claims, 7 Drawing Sheets

METHOD AND APPARATUS FOR CONTROL OF LASING WAVELENGTH IN DISTRIBUTED FEEDBACK LASERS

This application is a continuation of application Ser. No. 08/114,125 filed on Aug. 30, 1993, now abandoned.

FIELD OF THE INVENTION

The present invention relates generally to a method and apparatus for varying the lasing wavelength of distributed feedback lasers. This invention is particularly useful for high capacity wavelength-division-multiplexing in optical fiber amplifying transmission systems.

BACKGROUND OF THE INVENTION

Information transfer over an optical fiber transmission system can be increased by multiplexing several signals on a single fiber. In wavelength-division-multiplexing ("WDM"), a plurality of optical sources are used to transmit a plurality of optical signals on a single optical fiber. Each source operates at a different wavelength.

In high capacity WDM systems, the lasers must operate at precisely determined wavelengths with fine wavelength separations from one laser to the next of about 0.8 to 1.6 nanometers (nm). Such precise wavelength control can be achieved by using a distributed feedback (DFB) laser.

DFB lasers employ a periodic structure, typically a corrugated slab or grating known as a distributed Bragg diffraction grating to achieve single frequency operation. The grating is designed so that light of a particular wavelength will be reflected constructively. This is known as Bragg reflection. Lasing occurs at this particular wavelength, the Bragg wavelength, with diffraction losses preventing other modes from lasing. It is understood that as used herein, "distributed feedback" or "DFB" lasers refer to distributed Bragg reflector (DBR) lasers, as well.

One way to alter the operating wavelength of a DFB laser is to change the period of the grating. The period is given by $\Lambda = m\lambda_0/2N_{eff}$ where $\Lambda$ is the period of the grating; m is the integer order of the grating; $\lambda_0$ is the Bragg wavelength (the lasing wavelength); and $N_{eff}$ is the effective refractive index of the propagating mode in the active stripe.

A 0.8 nm wavelength separation in 1.55 μm DFB lasers corresponds to a grating pitch difference of 0.13 nm. Such fine control over grating pitch manufacture has been demonstrated by holographic and contact printing techniques. In the holographic technique, resists are exposed using two interfering UV laser beams, and then etched. See, for example, Pakulski et al., "Fused silica masks for printing uniform and phase adjusted gratings for distributed-feedback lasers," Appl. Phys. Lett. 62(3), 222–24; Okuda et al., "Monolithically integrated GaInAsP/InP Distributed Feedback Lasers," Fourth Int'l Conf. Integrated Optics and Optical Fiber Comm., Tokyo, Japan, paper 28B1-4; and U.S. Pat. No. 4,517,280 issued to Okamoto et al. The contact printing technique utilizes an electron beam (e-beam) to directly expose a resist, such as p-methylmethacrylate, that covers the substrate which is to contain the grating. Once the resist is patterned, the grating is etched. See Pakulski, et al.

The holographic technique proves to be rather cumbersome and not readily reproducible in generating grating pitch steps of 0.1 nm or smaller. The contact printing technique requires the reproducible generation of phase masks with grating-pitch steps of 0.1 nm by electron-beam lithography. This is an extremely demanding task for electron-beam lithography which requires extremely accurate and stable beam control down to less than 0.1 nm.

Accordingly, there is a need for a simple, more reproducible technique for varying the lasing wavelength of DFB lasers.

SUMMARY OF THE INVENTION

In accordance with the invention, the aforementioned problem is solved and a technical advance is achieved by a method and apparatus for varying the lasing wavelenth of DFB and DBR lasers by angling the active stripe at an oblique angle with respect to the axis of the grating.

DETAILED DESCRIPTION

Figure 1:
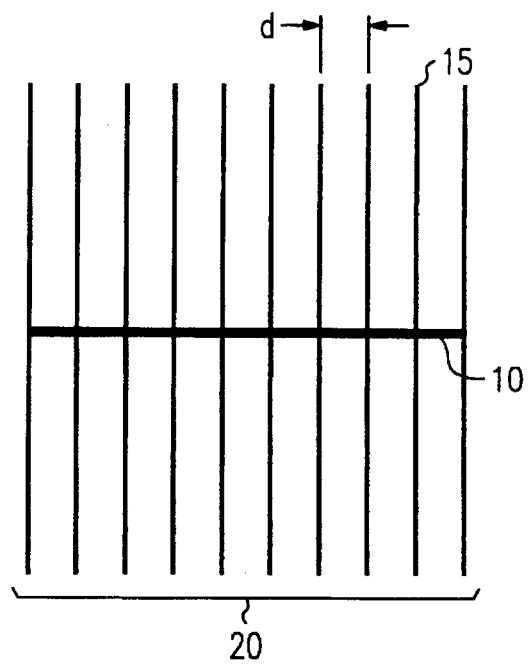
FIG. 1 is a schematic diagram which illustrates the orientation of the active stripe and the grating in a conventional prior art DFB laser.
Figure 2:
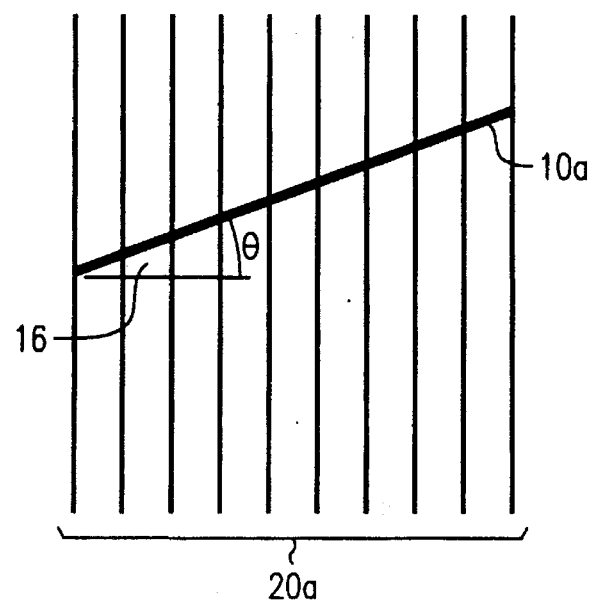
FIG. 2 is a schematic diagram which illustrates the angled orientation of the active stripe and the grating in the waveguide and DFB laser according to the present invention.

FIG. 1 illustrates a conventional waveguide, such as may be used in a DFB laser, with an active stripe 10 oriented perpendicular to the lines 15 of grating 20. The spacing between the lines of the grating, i.e., the period of the grating, is represented by the distance d. FIG. 2 illustrates the angled-stripe waveguide of the present invention, where the active stripe 10a is formed at an angle e with respect to a line 16 perpendicular to the lines of grating 20a.

Figure 3:
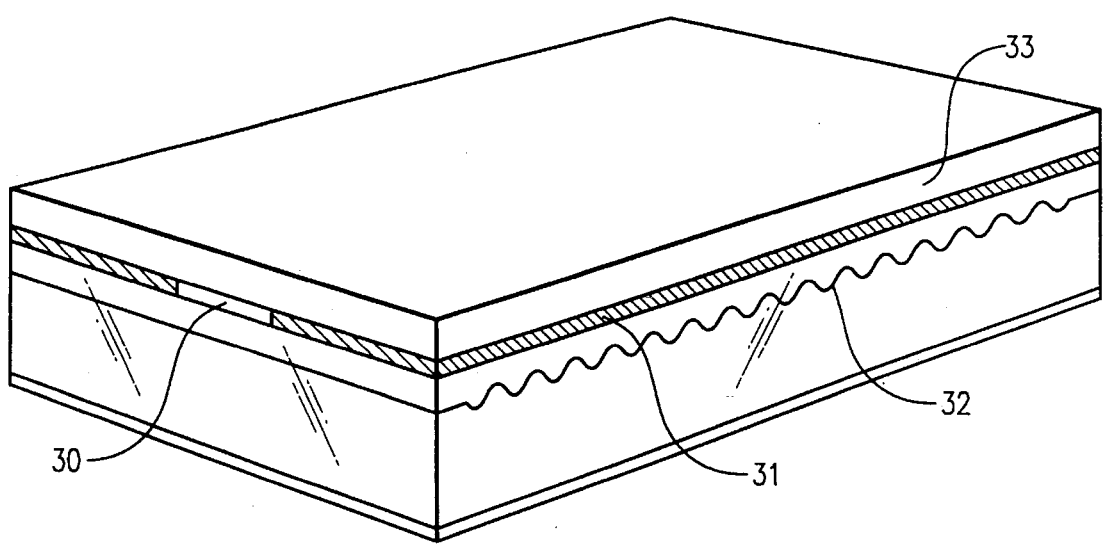
FIG. 3 is a representation of several layers of a conventional semiconductor laser incorporating an active stripe and a grating.

The purpose of the active stripe 10 is to provide optical containment in the horizontal plane. Typical single-mode optical fiber communication injection lasers utilize a double heterostructure (DH). A heterostructure is an interface between two adjoining single crystal semiconductors with different bandgap energies. While the DH confines optical emissions in the vertical direction, lasing occurs across the full width of the semiconductor slab. A number of problems are associated with such an arrangement, including difficulties with heat sinking and coupling to optical fibers. This problem may be solved by limiting the majority of the current flow through the semiconductor to an "active stripe,"

created by establishing regions of high resistance on either side of the stripe and by creating a higher refractive index in the stripe than outside the stripe for waveguiding. Thus, the active stripe provides a guide for the propagating mode of the laser due to gain difference inside and outside the stripe. The stripe may be formed by methods such as proton bombardment, oxide isolation or by creation of a buried heterostructure. A typical prior art active stripe 30 is shown in FIG. 3. FIG. 3 is a representation of several layers of a semiconductor DH injection laser. See generally, Optical Fiber Communications-Principles and Practice by J. M. Senior at 311–20 (Prentice Hall, 2nd ed., 1992).

Figure 4:
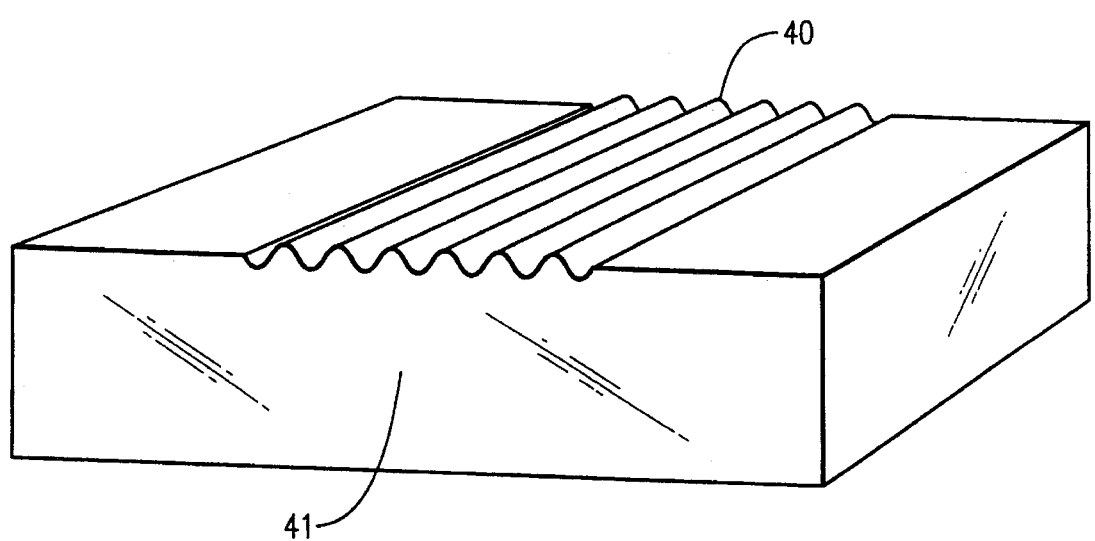
FIG. 4 is an illustration of a prior art grating in a substrate.

As previously discussed, the grating is the means employed by a distributed feedback laser to achieve single frequency operation. The grating pattern is etched into the surface of a substrate, typically Indium Phosphide, InP. FIG. 4 shows a grating 40 formed in a substrate 41. The grating is usually not etched into the active layer; rather, the grating layer is adjacent to the layer containing the active stripe, or there may be a buffer layer between the active layer and the grating layer. A grating 32 is also shown in FIG. 3. See Optical Fiber Communications-Principles and Practice at 332–36, 546–48 .

In the prior art arrangement of FIGS. 1 and 3, the active stripe is oriented perpendicular to the lines of the grating. However, in the angled-stripe waveguide and DFB laser of the present invention, shown in FIG. 2, the active stripe guiding the propagating mode is formed at an angle $\Theta$ with respect to a line 16 perpendicular to the lines of the grating. As discussed further below, the DFB lasing wavelength can be varied very simply and conveniently by changing the angle of the active stripe with respect to the longitudinal axis of the grating.

The lasing wavelength in air for an angled-stripe DFB laser is given by $\lambda_0 = 2\Lambda N_{eff}/m\cos\Theta$ where $\Theta$ is the angle subtended by the active stripe with respect to the longitudinal axis of the grating. $\lambda_0$ increases with increasing $\Theta$. Note that when $\Theta=0$, corresponding to the arrangement of a conventional DFB laser in which the active stripe is perpendicular to the grating-lines, the above equation reduces to $\lambda_0 = 2\Lambda N_{eff}/m$.

Figure 5:
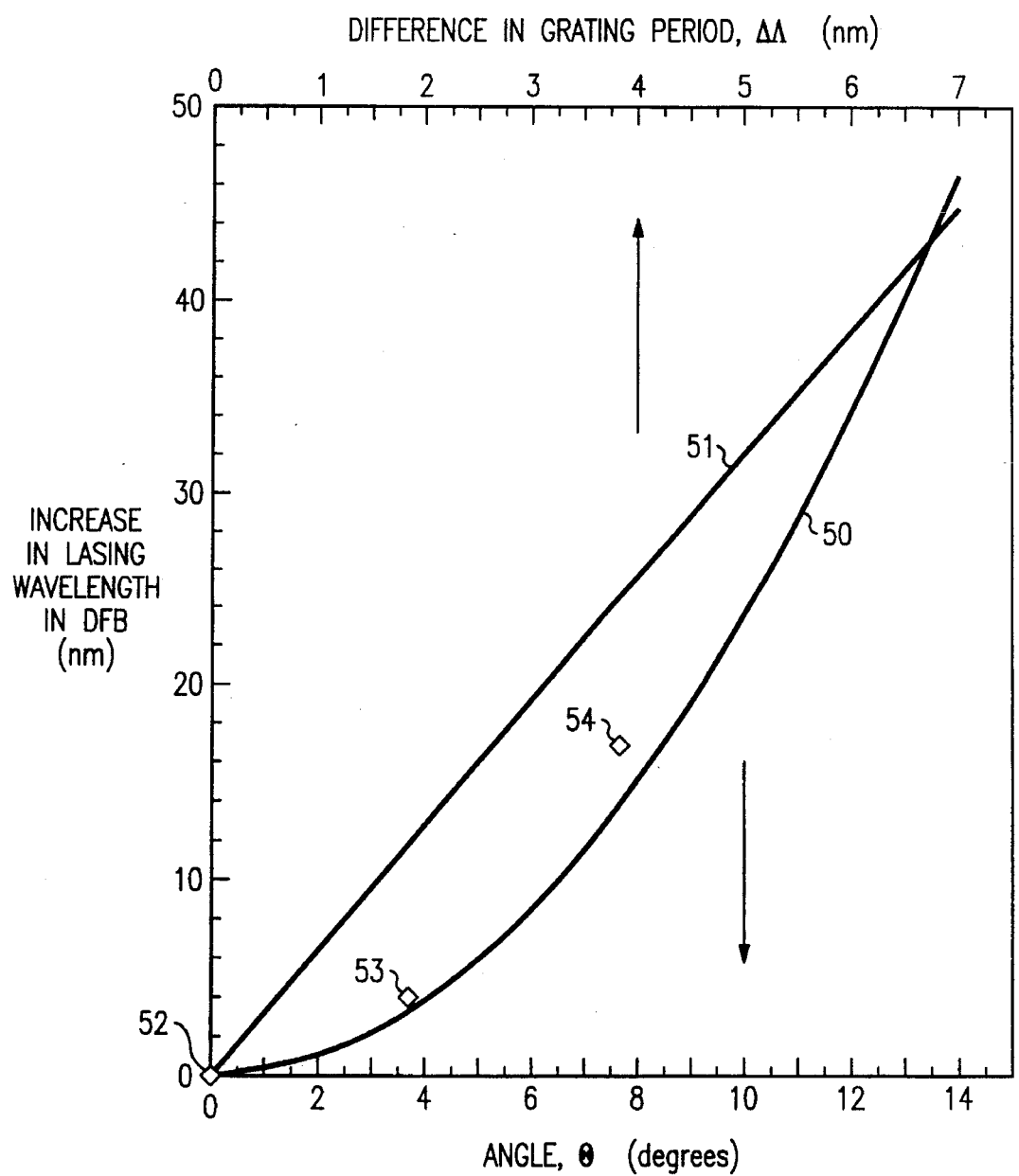
FIG. 5 is a graph showing plots of the change in lasing wavelength as a function of the change in the angle of the active stripe and also as a function of the change in grating period for purposes of side by side comparison.

Curve 50 in FIG. 5 shows the increase in DFB lasing wavelength $\Delta\lambda_0$ from that for $\Theta=0$, as a function of $\Theta$, while curve 51 plots $\Delta\lambda_0$ as a function of increasing $\Delta\Lambda$ for $\Lambda=236$ nm. In these calculations, a first order grating m=1, and an effective refracting index $N_{eff}=3.22$ are used so that the DFB laser operates at about 1.52 µm for comparison with experimental results (indicated by diamond shapes 52–54). With reference to FIG. 5, examination of curve 50 shows that for a small change in lasing wavelength (less than approximately 6 nm), such change is relatively insensitive to $\Theta$. However, for larger changes in lasing wavelength (greater than approximately 40 nm), the dependence on $\Theta$ is significant, i.e., the slope of the curve 50 is steep and small changes in $\Theta$ result in large increments in lasing wavelength.

The angled-stripe waveguide and DFB laser may be fabricated by utilizing conventional fabrication techniques. First, a multi-layer (epilayer) laser structure is grown over a uniform grating. The pattern for a mesa is aligned at the desired angle with respect to a line perpendicular to the grating lines. The mesa is then etched down to the substrate forming the angled active stripe. The mesa is subsequently buried by current blocking layers grown on both sides of the mesa. Finally ohmic contacts are added and the structure is cleaved to form laser diodes according to the present invention. It will be understood by one skilled in the art that there are alternate methods for forming the active stripe. Other methods may be used without departing from the scope and spirit of this invention.

Gain-coupled DFB lasers embodying the invention have been made and tested. A plurality of lasers utilizing quantum well gratings from the same base epilayer wafer with the active stripes aligned at $\Theta=3.7°$ and $7.7°$ were built. Similarly, a plurality of lasers with $\Theta=0°$ were also constructed for comparison purposes. The quantum well grating technique is known in the art, for example, see Tsang et al., "Semiconductor distributed feedback lasers with quantum well or superlattice gratings for index or gain-coupled optical feedback," Appl. Phys. Lett. 60(21) at 2580–82. Gain-coupled DFB lasers are preferably used, since they tend to lift the two-mode degeneracy of index coupled DFB lasers.

The averaged increase in lasing wavelengths (relative to $\Theta=0$) from a representative sampling of the lasers is plotted (52–54) as a function of $\Theta$ in FIG. 5. Curve 50 of FIG. 5 represents the predicted relationship between $\Theta$ and increase in lasing wavelength. The wavelength variation within each sample (1 cm$^2$) is $-1-1.5$ nm. This corresponds to a mesa width variation of $-0.25\mu m$, a reasonable value for wet chemically etched mesas. Reproducible and precise mesa width control is therefore essential for producing DFB lasers with fine wavelength steps of 0.8–1.6 nm. In addition, the two-mode degeneracy in index-coupled DFB lasers, which typically have a stop-band of $-2$ nm, must be lifted by employing ¼ λ-shifted, gain-coupled, or DBR approaches.

Figure 6:
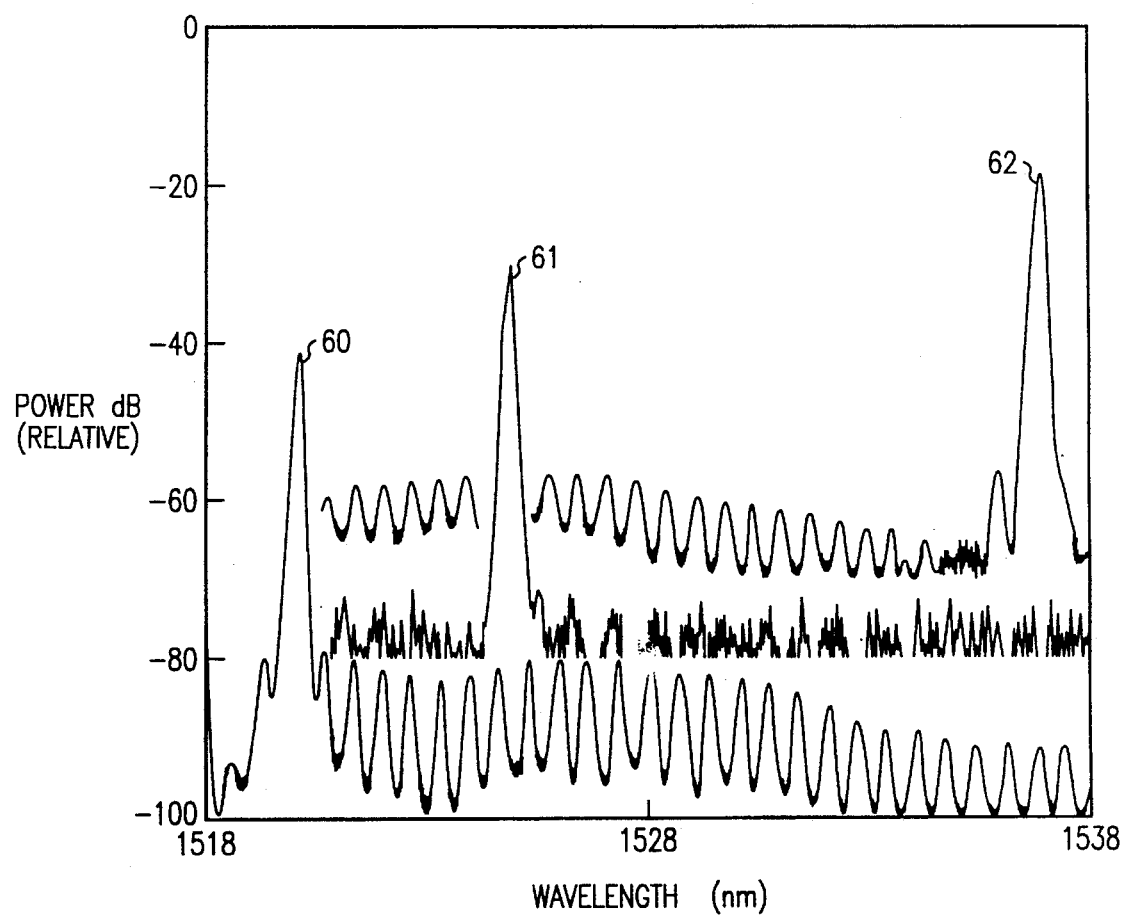
FIG. 6 is a graph of the continuous wave (CW) lasing spectra for three laser samples showing the change in lasing wavelength with Θ.

FIG. 6 shows the CW lasing spectra of a typical laser from each sample. Spectra 60 is for a sample laser in which $\Theta=0°$, spectra 61 is for a sample with $\Theta=3.7°$, and spectra 62 is for a sample with $\Theta=7.7°$. All lasers checked have side-mode-suppression ratios greater than 40 dB and CW threshold currents of 15–18 mA for 500 µm long cavity. Lasers from all three samples behave practically identically except for the shift in lasing wavelength. There appears to be a slight decrease in the coupling coefficient $\kappa$ as $\Theta$ increases. However, because the samples come from near the edge of a 2-inch substrate, some variation in grating quality is expected.

Figure 7:
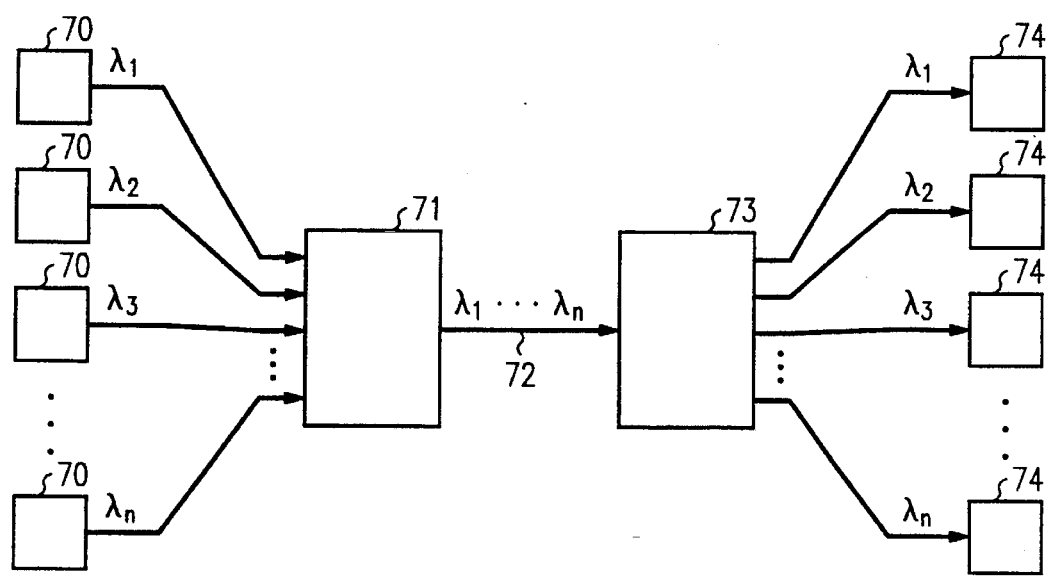
FIG. 7 is a block drawing of DFB/DBR lasers according to the present invention being used in a WDM fiber optics system.
Figure 8:
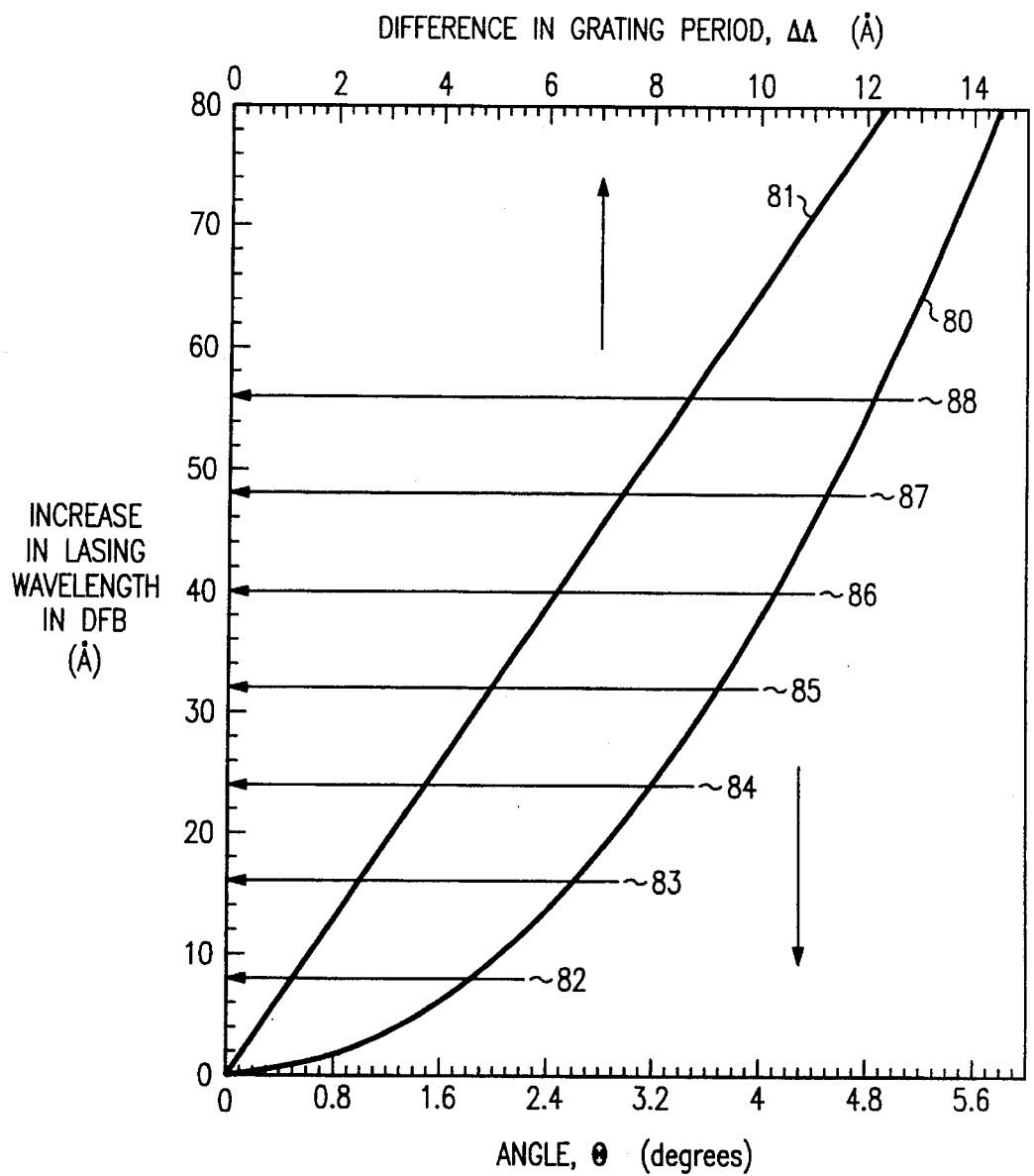
FIG. 8 is a graph showing similar plots to those of FIG. 5, but expanded for angle 8 and calculated for DFB lasers starting at 1549.4 nm suitable for WDM systems using Erbium-doped fiber amplifiers and also illustrating channel spacing for an eight channel WDM system.

Thus, the cos $\Theta$-dependence of lasing wavelength in angled-stripe DFB or DBR lasers is particularly suitable and convenient for fine wavelength control, such as for WDM applications. FIG. 7 illustrates the use of the angled-stripe DFB or DBR lasers in a WDM system. Each laser 70 operates at a precisely determined wavelength which differs by a small amount, typically 0.8 to 1.6 nm, from the next laser. The signals are multiplexed by a multiplexer 71 transmitted in parallel on a single optical fiber 72 demultiplexed in a demultiplexer 73 and routed to receivers 74. The successive increase in operating wavelength for each of the angled-stripe lasers is illustrated in FIG. 8 for an eight channel system. Channel "2" 82 is shown to operate at a wavelength 8 angstroms (0.8 nm) higher than channel "1" (channel 1 operates at the reference point, i.e, "0" increase in wavelength), with each succeeding channel 83–88 operating at a wavelength 8 angstroms higher than the previous channel. Referring again to FIG. 8, to achieve such separation by adjusting grating pitch in conventional DFB and DBR lasers requires having to fabricate a grating pitch difference of 1.3 angstroms (0.13 nm). By contrast, such separation can be easily controlled and reproducibly achieved in angled stripe lasers by angling the stripe at successively greater angles. $\Theta$ is about 1.8° for the stripe of the channel "2" laser 82 and about 4.8° for the channel "8" laser 88. The minimum required change in angle $\Theta$, going from channel "7" to channel "8," is about 0.4°.

This technique is particularly convenient for monolithic integration of different wavelength DFB lasers for WDM applications. In one embodiment of monolithically integrated lasers, the output from the lasers is combined to form a single output beam. This is accomplished by optically coupling each DFB laser into a passive waveguide. Then, all the passive waveguides extending from each DFB laser are combined into a single passive waveguide. The resulting single output beam can then be coupled into an optical fiber. Another application of the technique is to fabricate a series of varying angled-stripes on the same corrugated wafer so that there will always be some angled-stripe DFB or DBR lasers that are optimally designed even if there is some slight variation of $N_{eff}$, due to thickness, composition or mesa width variations across the wafer.

It is to be understood that the above-described embodiments are merely illustrative of the invention. Other applications and arrangements may be devised by those skilled in the art without departing from the spirit and scope of the invention.

I claim:

1. A method for operating an optical fiber transmission system comprising:

using a plurality of lasers to transmit information in the form of optical signals wherein at least two of the lasers comprise a substrate layer further comprising a first and a second end face and a periodic structure defining a plurality of grating lines, wherein the grating lines are parallel to said end faces, and an epilayer layer in parallel relation to the substrate layer wherein said epilayer has an active stripe, the entirety of which active stripe is oriented at a single nonzero angle with respect to a line perpendicular to the grating lines of the periodic structure with said nonzero angle being different for each of said at least two of the plurality of lasers;

operating said plurality of lasers such that each laser operates at a single, unique, precisely determined wavelength, the angle of the active stripes of said at least two lasers causing said at least two lasers to attain a precise difference in operating wavelength.

2. The method of claim 1 where the optical fiber transmission system utilizes wavelength-division-multiplexing.

3. The method of claim 1 where at least one laser is a distributed feedback laser.

4. The method of claim 1 where at least one laser is a distributed Bragg reflector laser.

5. The method of claim 3 where the lasers are monolithically integrated.

6. The method of claim 4 where the lasers are monolithically integrated.

7. The method of claim 5 where the output from at least two lasers are optically combined.

8. The method of claim 6 where the output from at least two lasers are optically combined.

9. The method of claim 3 where at least one laser is gain-coupled.

10. The method of claim 4 where at least one laser is gain-coupled.

11. The method of claim 1 where said precisely determined wavelength is determined substantially according to the relationship $\lambda_0 = 2\Lambda N/m\cos\Theta$, where: $\lambda_0$ is the operating wavelength; $\Lambda$ is the period of the periodic structure; $N_{eff}$ is the effective refractive index of the propagating mode in the active stripe; m is the integer order of the periodic structure; and $\Theta$ is the angle subtended by the active stripe with respect to a line perpendicular to the grating lines of the periodic structure.

12. A method for transmitting a wavelength-division-multiplexed signal comprising:

transmitting information in a first format in the form of a plurality of optical signals using a plurality of lasers, wherein at least one of said lasers utilizes an angled-stripe waveguide;

processing said plurality of optical signals into a second format using a multiplexer, wherein said signals may be carried along a single optical path;

processing the signals from the second format to substantially the first format using a demultiplexer.

13. The method of claim 12 where the wavelength-division-multiplexing system comprises eight channels.

14. The method of claim 12 where the operating wavelengths of the lasers differ by a multiple of about 0.8 to about 1.6 nanometers.

15. The method of claim 12 where the angled-stripe waveguide comprises an active stripe and a grating defined by a plurality of lines, where the active stripe is oriented at a nonzero angle $\Theta$ with respect to a line perpendicular to the grating lines.

16. The method of claim 15 wherein $\Theta$ is less than about 5°.

* * * * *